(12) United States Patent  
Porter

(10) Patent No.: US 6,723,167 B2
(45) Date of Patent: Apr. 20, 2004

(54) SPINDLE SLEEVE FOR COATER/DEVELOPER

(75) Inventor: James A. Porter, Colorado Springs, CO (US)

(73) Assignee: Intel Corporation, Santa Clara, CA (US)

( * ) Notice: Subject to any disclaimer, the term of this patent is extended or adjusted under 35 U.S.C. 154(b) by 123 days.

(21) Appl. No.: 09/746,435

(22) Filed: Dec. 21, 2000

(65) Prior Publication Data

US 2002/0080337 A1 Jun. 27, 2002

(51) Int. Cl.[7] ............................................... B05C 11/02
(52) U.S. Cl. ........................... 118/52; 118/56; 118/500; 118/506
(58) Field of Search ........................... 118/52, 56, 320, 118/500, 506; 427/240, 425; 57/76; 34/58, 59, 312; 438/782; 150/154, 157, 165; 138/94, 115, 112

(56) References Cited

U.S. PATENT DOCUMENTS

| | | | | |
|---|---|---|---|---|
| 4,227,347 A | * | 10/1980 | Tam | 118/52 |
| 4,696,209 A | * | 9/1987 | Felten et al. | 279/130 |
| 5,562,947 A | * | 10/1996 | White et al. | 118/500 |
| 5,695,817 A | * | 12/1997 | Tateyama et al. | 427/240 |
| 6,213,478 B1 | * | 4/2001 | Nishikawa | 279/4.08 |

* cited by examiner

Primary Examiner—Richard Crispino
Assistant Examiner—George R. Koch, III
(74) Attorney, Agent, or Firm—Blakely, Sokoloff, Taylor & Zafman LLP

(57) ABSTRACT

In one embodiment of the invention, a sleeve that forms a hollowed cylinder to enclose a spindle. The sleeve has a thickness and a first length. A strut is mounted to the spindle to keep the sleeve from traveling up a shaft. The strut is slotted into a first slot on a top end of the hollowed cylinder.

24 Claims, 4 Drawing Sheets

SIDE VIEW OF SPINDLE SLEEVE
showing screw detail and inner/outer dimensions

TOP AND SECTION VIEWS OF SPINDLE SLEEVE
showing notches, halves and section GG-GG' from Fig. 3

SPINDLE STRUTS

SPINDLE SLEEVE FOR COATER/DEVELOPER

FIELD OF THE INVENTION

The present invention relates generally to the field of semiconductor, and specifically, semiconductor processing equipment.

BACKGROUND OF THE INVENTION

With an increased use of highly odiferous chemicals in the semiconductor processing environment (e.g., microlithography), odors emitted from these chemicals become more and more noticeable because some of the equipment used are not fully enclosed. For example, one of the equipment used in the lithography process is the Silicon Valley Group (SVG) 90xx series coater/developer. The 90xx series coater/developer has a gap between the spindle and the coater catch cup base plate. During the processing, the odiferous chemical emits odor via the gap and causes undesirable environment effects to personnel on the factory floor.

Therefore, there is a need to reduce the odiferous chemical odor from semiconductor processing equipment.

BRIEF DESCRIPTION OF THE DRAWINGS

The features and advantages of the present invention will become apparent from the following detailed description of the present invention in which.

DETAILED DESCRIPTION OF THE INVENTION

In the following description, for purposes of explanation, numerous details are set forth in order to provide a thorough understanding of the present invention. However, it will be apparent to one skilled in the art that these specific details are not required in order to practice the present invention.

Figure 1:
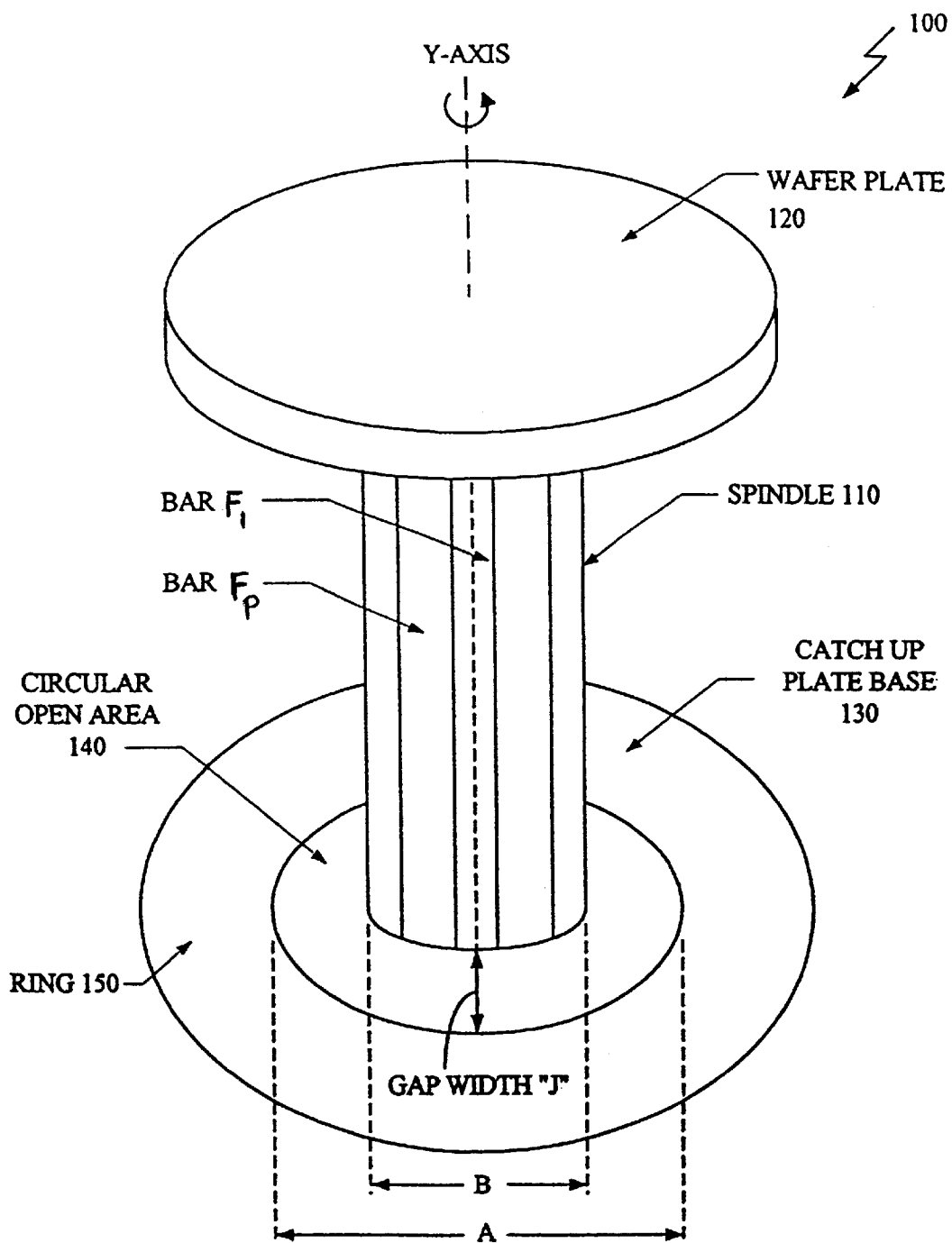
FIG. 1 is a diagram illustrating a coater/developer without a spindle sleeve according to the current practice in the field.

FIG. 1 is a diagram illustrating a coater/developer 110 used in the lithography (e.g., microlithography) process without an enclosed spindle sleeve. The coater/developer 100 includes a spindle 110 (including a chuck), a wafer plate 120, and a catch cup base plate 130.

The catch cup base plate 130, catch cup (not shown) and splash guard (not shown) are interlocking and held together by their combined weights. The spindle and chuck 110 are attached to the coater/developer track by mechanical fasteners. In one embodiment, there may be no direct connection between the catch cup base plate 130 assembly and the spindle 110.

During wafer processing a wafer rests on the chuck and is lowered into the catch cup assembly 130 by the spindle 110. The wafer is held above the bottom of the catch cup assembly 130 by the spindle 110 with only a minor gap in between them. Process chemicals are then applied to the wafers surface. Excess/expended process chemicals are drained from the catch cup assemble 130. The majority of the odor emission occurs during spindle 110 travel due to the spindle-catch cup assembly gap and also because of wafer travel induced turbulence in the processing chamber.

In one embodiment, the wafer plate 120 is on a top end of the spindle 110. The catch cup base plate 130 is at the bottom end of the spindle 110. The catch cup base plate 130 has a circular open area in the center 140 and a ring 150. The circular open area 140 has a diameter "a". The spindle 110 stations within the center of the circular open area 140. The spindle 110 has a diameter "b". In one embodiment, the diameter "b" of the spindle 110 is less than the diameter "a" of the open area 140. This creates a gap between the spindle 110 and the ring 150.

The spindle 110 includes bars $F_1$ to $F_P$. The bars $F_1$ to $F_P$ are actually chemical delivery tubes constructed of stainless steel. There location depends on the type of the coater/developer 110 used, hence the size of the notches on the interior of the spindle sleeve 210.

In one embodiment there are three bars $F_1$, $F_2$, and $F_3$. Bars $F_1$, $F_2$, and $F_3$ are located apart from one another and are longitudinally mounted to the spindle 110. The bars $F_1$, $F_2$, and $F_3$ may have rounded bottom depending on the type of spindle 110 used in the lithography process. The spindle 110 is capable of traveling in a vertical direction and the chuck of the spindle 110 is capable of rotating around the vertical axis. FIG. 1 shows the spindle 110 in the up position. When the spindle 110 is a down position, the wafer plate 120 may fit onto the top of the catch cup base plate 130 and the wafer plate 120 may cover the gap. The gap has a gap width "j". The dimension of the gap width "j" may vary depending on the type of coater/developer 100 used in the process.

Figure 2:
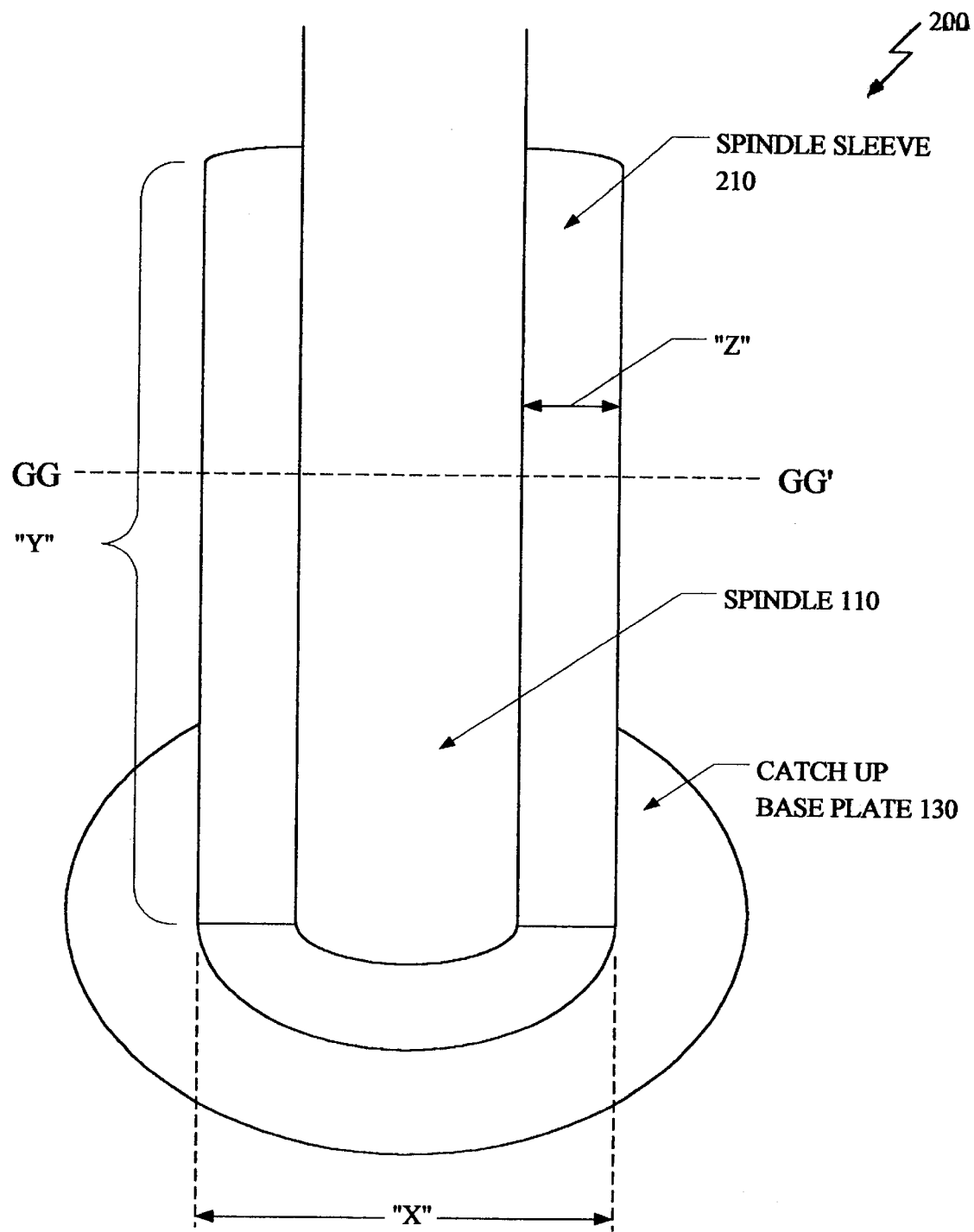
FIG. 2 is a diagram illustrating the coater/developer with the spindle sleeve in which one embodiment of the invention can be practiced.

FIG. 2 is a diagram illustrating the coater/developer 200 with a spindle sleeve 210 (cross section shown by line GG–GG'). The coater/developer 200 includes all the elements as in the coater/developer 100 in FIG. 1 and a spindle sleeve 210. The spindle sleeve 210 forms a hollowed cylinder 220 to enclose the spindle 110 to keep the fugitive odor form leaking out into a process base. The hollowed cylinder 220 splits open in a form of a rectangular cube (shown in FIG. 3). The spindle sleeve 210 is a three dimensional (3D) element having "x" width, "y" length, and "z" thickness. The "y" length may be shorter than the length of the spindle 110. The z thickness of the spindle sleeve 210 is sufficiently thick to cover the gap width j when it encloses the spindle 110. This allows the spindle sleeve 210 to travel freely with the spindle 110 in the vertical direction along the vertical "Y" axis and to rotate with the spindle 110 within the circular open area 140 (see FIG. 1) In one embodiment, the difference between the gap width "j" and the z thickness may be in a tenth of a fraction of an inch (i.e., 0.01"). It is noted that in one embodiment, the spindle sleeve 210 is made of Teflon material. However, the spindle sleeve 210 may be constructed from any acid resisting material.

The spindle sleeve 210 does not completely encased the spindle 110 so that during wafer processing the gap between the spindle 110 and catch cup is still open. This is necessary so that process chemicals may be injected under the wafer to dry and clean the wafer backside during processing. However, the spindle sleeve 110 may be completely enclosed the spindle 110. Over pressure of these chemicals could possibly force the wafer off of the chuck due to lack of sufficient space between the wafer and the catch cup bottom for adequate venting. Since the catch cup assembly is already heavily exhausted, odor migration is a minor issue with the wafer down.

Figure 3:
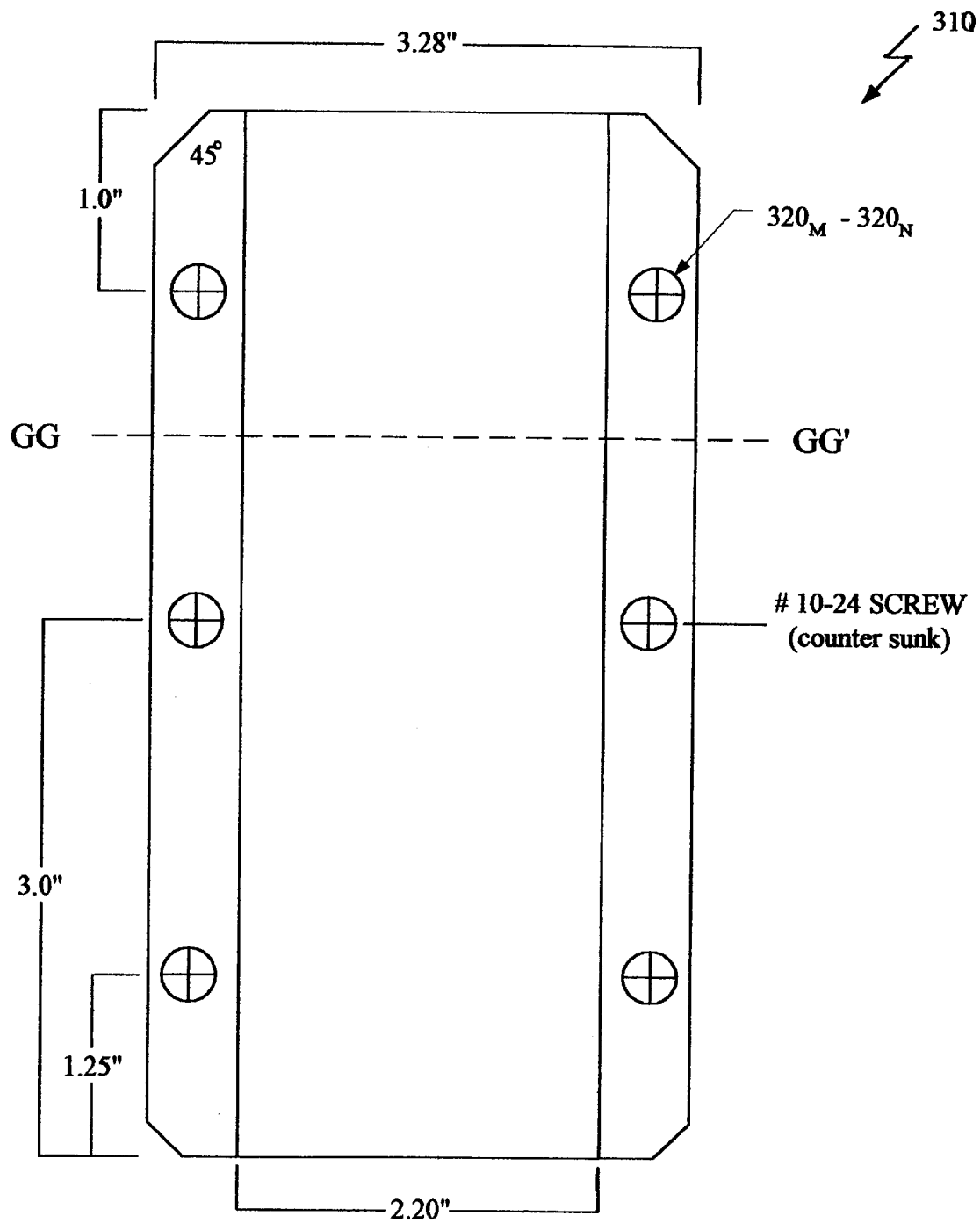
FIG. 3 is a diagram illustrating the spindle sleeve according to one embodiment of the present invention.

FIG. 3 is a diagram illustrating a side view of the spindle sleeve 210. When the spindle sleeve 210 splits open, it forms a rectangle with a thickness "z" (not shown) or a rectangular cube 310. The rectangular cube 310 has preset position for screwing with screws $320_1$ to $320_N$ (where N is a positive integer). Each of the screws $320_1$ to $320_N$ may have a screw head. The screws $320_1$ to $320_N$ screw the spindle sleeve 120 to form the hollowed cylinder 220. As discussed above, the rectangular cube 310 is a 3D element having dimensions x, y, and z. The x and y dimensions vary depending on the size of the spindle 110 and the z dimension varies depending the width gap "j" (e.g., the gap between the spindle 110 and the catch cup base plate 130). As shown, the "x" dimension is the width of the spindle sleeve 210, the "y" dimension is the length of the spindle sleeve 210, and the "z" dimension is the thickness of the spindle sleeve 210. The rectangular cube 310 forms the hollowed cylinder 220 to enclose the spindle 110 of the developer/coater 200. The rectangular cube 310 may be split longitudinally into a number of smaller rectangular cubes. For example, the rectangular cube may be split into two halves. Each half has the length "y", the thickness "z" and half of the width "x" of the spindle sleeve 210. It is noted that the rectangular cube may be slit into smaller rectangular cubes or into any shapes and sizes, however, the thickness "z" is the same even though the length and width of the rectangular cube vary. It is noted that no matter how the rectangular cube is slit, the total length and the total width are the length "y" and the width "x", respectively. The smaller rectangular cubes are attached together by attachment elements such as screws $320_1$ to $320_N$.

Figure 4A:
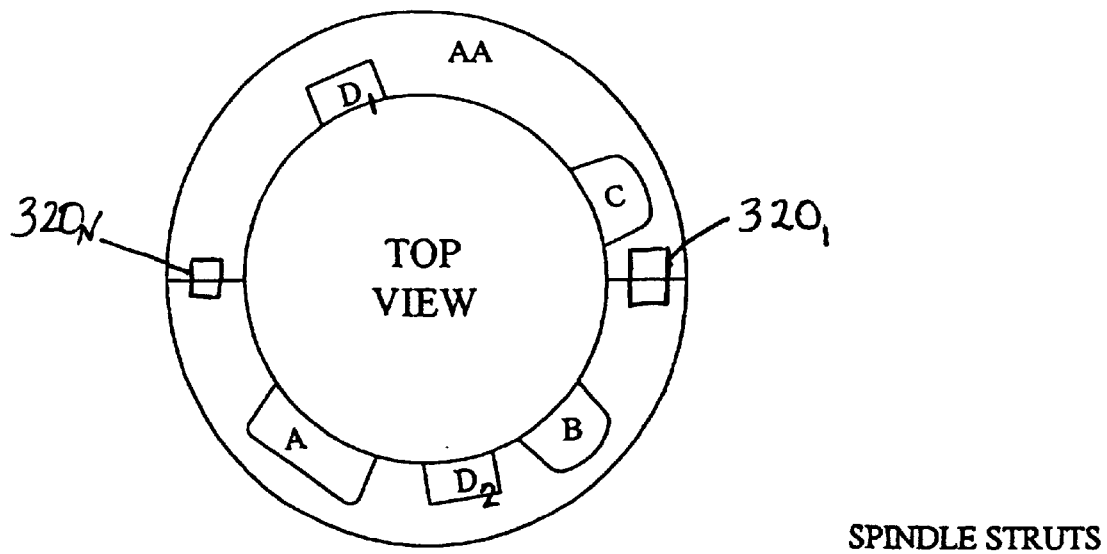
FIG. 4A is a diagram illustrating a top view of a hollowed cylinder according to one embodiment of the present invention.
Figure 4B:
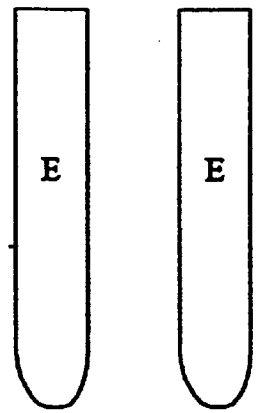
FIG. 4B is a diagram illustrating spindle struts according to one embodiment of the present invention.
Figure 4C:
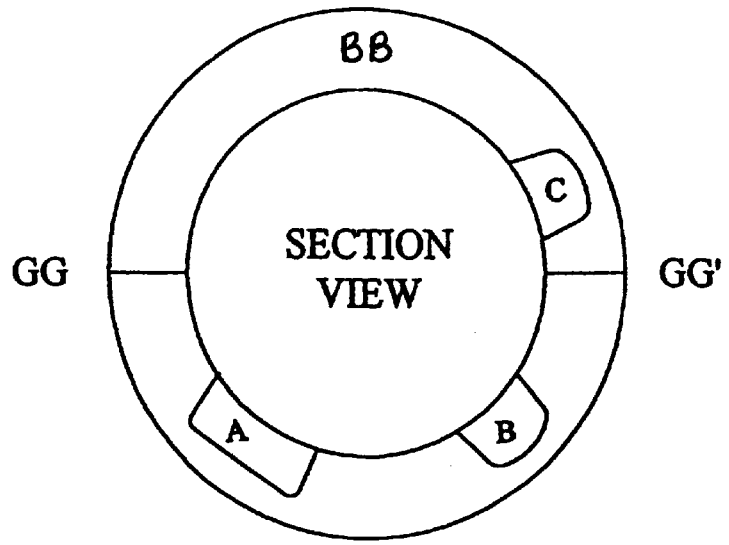
FIG. 4C is a diagram illustrating a cross section view of the hollowed cylinder according to one embodiment of the present invention.

FIGS. 4A and 4C show the top and section views of the hollowed cylinder 220. The spindle sleeve 210 includes two rectangular cubes AA and BB (shown in FIGS. 4A and 4C) to form the hollowed cylinder 220 having the length "y". Typical value of the length "y" is 6 inches. The two rectangular cubes AA and BB are connected by the screws $320_1$ to $320_N$. The two rectangular cubes as attached to form a hollowed cylinder 220 as shown on FIGS. 4A and 4C as parts AA and BB. The screws $320_1$ to $320_N$ may be spaced from each another. For example, on each side of the rectangular cube, the screws are spaced at 1.25 inches, 3.0 inches from the bottom end of the cylinder and another screw is screwed 1.00 inch from the top end of the cylinder. The 3 inches spacing up from the bottom may be necessary so that the sleeve 210 may be installed on the spindle 110 with all parts (catch cup assembly and spindle) in place. However, the spacing distance between the screws $320_1$ to $320_N$ and from the bottom end to a screw may vary as long as the sleeve 210 and all the parts are properly installed. The screws $320_1$ to $320_N$ are counter sunk into the cylinder so the screw heads are covered and do not project beyond the external curvature of the hollowed cylinder 220.

The hollowed cylinder 220 is tapered at the top end and the bottom end of the spindle sleeve 210. The spindle sleeve 210 is tapered at the ends because the spindle 110 rises back and forth (in vertical direction) between the base plate 130 and if there is any slight misalignment between the base plate 130 and the spindle 110, the spindle sleeve 210 may rub on the base plate 130 which can cause the lifting of the base plate 130. This keeps the spindle sleeve 210 from hitting into the bottom of the base plate 130. The tapered ends act as a self guiding taper. The length of the tapered at the top end may be longer than the length of the tapered at the bottom end. In other words, the taper is steeper and taller at the top end to avoid the spindle sleeve 210 from lifting up the base plate 130 as the spindle 110 is rising. The tapered end forms a taper angle. The taper angle is the angle between the tapered edge and the vertical axis (as shown in FIG. 3). The taper angle is ranging from 25 to 60 degrees. In one embodiment, the width "x" of the sleeve is 3.28 inches wide and the thickness "z" of the sleeve is 0.56 inches. This thickness "z" is slightly less than the gap width "j" (shown in FIG. 1). In other words, the thickness "z" of the rectangular cube (AA or BB) is slightly less that the gap width "j" to assure that the spindle sleeve 210 enclosing the spindle 110 and that the spindle sleeve 210 can travel freely with the spindle 110 in the vertical direction. When the spindle 110 is rotating, the spindle sleeve 210 enclosing the spindle also rotates freely with the spindle 110 in a same fashion as the chuck rotation described earlier. The length of the taper at the top end is twice the length of the taper at the bottom end. Also, the taper angle is 45 degrees. The tapering process eliminates the risk of the spindle sleeve 210 displacing the catch up base plate 130. It is noted that the length and the angle of the taper at the top end and the bottom end may vary, however, in a preferred embodiment, the length taper of the top is longer than the length of the taper at the bottom end.

FIG. 4A is a diagram illustrating a top view of the hollowed cylinder 220. As stated above, the hollowed cylinder 220 is formed by one or more rectangular cubes (i.e., AA and BB) by screws $320_1$ to $320_N$. The hollowed cylinder 220 is formed by two rectangular cubes AA and BB. The hollowed cylinder 220 has M slots $D_1$ to $D_M$ (where M is a positive integer). The slots $D_1$ to $D_M$ are positioned on the top end of the spindle sleeve 210. In one embodiment, M=2 (as shown in FIG. 4A).

FIG. 4B is a diagram illustrating spindle struts $E_1$ to $E_M$ according to one embodiment of the present invention. The number of struts used is typically the same as the number of slots in the hollowed cylinder 220. Each of the struts $E_1$ to $E_M$ may be made of same material as the spindle sleeve 210 (e.g., Teflon). The struts $E_1$ to $E_M$ are mounted to the spindle sleeve 210 and fit into slots $D_1$ to $D_M$ on the top end of the spindle 110, respectively. The size of the slots $D_1$ to $D_M$ also correspond to the size of the struts $E_1$ to $E_M$. The struts $E_1$ to $E_M$ has a strut width, a strut length, and a strut thickness. The struts may be of the same size or different sizes. In one embodiment, the struts are 0.375 inches wide, 1.97 inches long, and 0.25 inches thick. The struts $E_1$ to $E_M$ may have a rounded bottom that match the bottom curvature of the slots $D_1$ to $D_M$. The struts $E_1$ to $E_M$ are used to keep the spindle sleeve 210 from traveling up the spindle shaft when force is applied to the bottom end of the spindle sleeve 210. In other words, the struts $E_1$ to $E_M$ are used to brace the spindle 110 against force applied from the side of the spindle sleeve 210.

FIG. 4C shows the top view of the spindle sleeve 210 as well as a cross section along the line GG–GG' as shown in FIG. 2. The sleeve also includes a plurality of grooves. The number of grooves correspond to the number of bars $F_1$ to $F_P$ (where P is a positive integer) (i.e., bars A', B', C') as show in FIG. 1. The size of the grooves depends of the size of the bars on the spindle 110 and the size of the bars $F_1$ to $F_P$ depends on the type of the spindle used in the microlithography process. For example, in FIG. 4C, Groove A is wider that Grooves B and C so that the assembled part will fit the available spindles for the SVG 90xx series tracks (i.e., SVG 90, 90S, and 90SE). Grooves A, B, and C correspond to bars A', B', and C', respectively. However, the size of each groove may vary depending on the type of the spindle used.

From the top view and the cross section, each groove has a depth and a width. In one embodiment, there are three grooves A, B, and C. Each groove has a depth and a width. All grooves are 0.375 inches deep with the following widths:

Groove A=0.75 inches

Groove B=0.5 inches

Groove C=0.5 inches

The grooves A, B, and C have the full length of the hollowed cylinder 220. The bottom edge profiles of these grooves are rounded to correspond to the bar A', B', and C' rounded bottom, respectively. The existence of the grooves depends on the existence of the bars. The grooves provide a better fit of the sleeve that encloses the spindle.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:

a sleeve to enclose a spindle, the sleeve forming an elongated hollowed cylinder having a thickness and a first length, wherein said sleeve further comprises a plurality of elongated slots extending longitudinally within a wall of said cylinder; and a plurality of elongated struts situated longitudinally and respectively within said elongated slots of the sleeve to keep the sleeve from traveling up said spindle.

2. The apparatus of claim 1 wherein the hollowed cylinder comprises two halves, the two halves being split longitudinally, each half having a first width, the first length, and the thickness.

3. The apparatus of claim 2 further comprising an attaching element to hold the two halves to form the hollowed cylinder that encloses the spindle.

4. The apparatus of claim 3 wherein the attaching element to hold the two halves is a screw.

5. The apparatus of claim 1 wherein the hollowed cylinder is tapered on the top and a bottom ends.

6. The apparatus of claim 5 wherein the tapered top end forms a taper angle ranging from 25 to 60 degrees.

7. The apparatus of claim 6 wherein the taper angle is 45 degrees.

8. The apparatus of claim 1 wherein the sleeve comprises a groove having a depth and a second width, the depth is less than the thickness of the sleeve.

9. The apparatus of claim 8 wherein the groove has the first length.

10. The apparatus of claim 9 wherein the groove is rounded on a bottom edge.

11. The apparatus of claim 1 wherein the sleeve is made of an acid resisting material.

12. The apparatus of claim 1 wherein the strut is made of an acid resisting material.

13. A method comprising:

enclosing a spindle by a spindle sleeve, the sleeve forming an elongated hollowed cylinder having a thickness and a first length, wherein said sleeve further comprises a plurality of elongated slots extending longitudinally within a wall of said cylinder; and mounting a plurality of elongated struts respectively within said elongated slots of the spindle to keep the spindle sleeve from traveling up said spindle.

14. The method of claim 13, wherein the hollowed cylinder comprises two halves, the two halves being split longitudinally, each half having a first width, the first length, and the thickness.

15. The method of claim 14 further comprising attaching the two halves by an attaching element to form the hollowed cylinder that encloses the spindle.

16. The method of claim 15 wherein the attaching element to hold the two halves is screw.

17. The method of claim 13 further comprising tapering a top end of the spindle sleeve.

18. The method of claim 17 wherein the tapered top end forms a taper angle ranging from 25 to 60 degrees.

19. The method of claim 18 wherein the taper angle is 45 degrees.

20. The method of claim 13 wherein the sleeve is made of an acid resisting material.

21. The method of claim 13 wherein the strut is made of an acid resisting material.

22. A system comprising:

a wafer plate with a chuck;

a base plate having a circular open area; and a device attached to the wafer plate a top end and being centered in the circular area, the device comprising:

a spindle supporting said wafer plate and extending coaxially through said circular open area of said base plate;

a sleeve to enclose a spindle, the sleeve forming a hollowed cylinder having thickness and a first length, wherein said sleeve further comprises a plurality of elongated slots extending longitudinally within a wall of said cylinder, and a plurality of elongated struts situated longitudinally and respectively within said elongated slots of the sleeve to keep the sleeve from traveling up said spindle.

23. The system of claim 22 wherein the hollowed cylinder comprises two halves, the two halves being split longitudinally, each half having a first width, the first length, and the thickness.

24. The system of claim 23 further comprising an attaching element to hold the two halves to form the hollowed cylinder that encloses the spindle.

\* \* \* \* \*